(12) United States Patent
Li

(10) Patent No.: US 12,484,209 B2
(45) Date of Patent: Nov. 25, 2025

(54) METHOD FOR MANUFACTURING SEMICONDUCTOR STRUCTURE, SEMICONDUCTOR STRUCTURE AND THREE-DIMENSIONAL STRUCTURE

(71) Applicant: CHANGXIN MEMORY TECHNOLOGIES, INC., Hefei (CN)

(72) Inventor: Xiaojie Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 615 days.

(21) Appl. No.: 17/897,271

(22) Filed: Aug. 29, 2022

(65) Prior Publication Data

US 2023/0422464 A1 Dec. 28, 2023

Related U.S. Application Data

(63) Continuation of application No. PCT/CN2022/105645, filed on Jul. 14, 2022.

(30) Foreign Application Priority Data

Jun. 22, 2022 (CN) .......................... 202210714303.4

(51) Int. Cl.
*H10B 12/00* (2023.01)
(52) U.S. Cl.
CPC ................... *H10B 12/01* (2023.02)
(58) Field of Classification Search
CPC ......... H10B 12/01; H10B 12/03; H10B 12/05
See application file for complete search history.

(56) References Cited

U.S. PATENT DOCUMENTS

| 10,978,297 | B1* | 4/2021 | Luan | .................. | H01L 21/0259 |
| 11,094,699 | B1 | 8/2021 | Brewer | | |
| 2020/0395373 | A1 | 12/2020 | Huo et al. | | |
| 2021/0233767 | A1* | 7/2021 | Luan | .................. | H10D 18/251 |
| 2021/0335993 | A1 | 10/2021 | Lu | | |

FOREIGN PATENT DOCUMENTS

| CN | 110211965 | A | | 9/2019 | | |
| CN | 111415938 | A | | 7/2020 | | |
| CN | 111415939 | A | | 7/2020 | | |
| CN | 113410179 | A | | 9/2021 | | |
| KR | 20220016709 | A | * | 2/2022 | ............ | H10D 88/00 |

* cited by examiner

*Primary Examiner* — Edward Chin
(74) *Attorney, Agent, or Firm* — Syncoda LLC; Feng Ma

(57) ABSTRACT

A method includes: providing a substrate including a first region and a second region; a stacked structure being formed on the substrate, the stacked structure including a first semiconductor layers and a second semiconductor layers stacked alternately in sequence along a direction perpendicular to a plane where the substrate is located; etching the stacked structure, such that the first semiconductor layers and the second semiconductor layers located in the second region respectively form a first sub-part extending in a first direction and a third sub-part extending in the first direction; the first semiconductor layers and the second semiconductor layers remaining in the first region respectively constitute a second sub-part extending in a second direction and a fourth sub-part extending in the second direction; removing the third sub-part; and forming a first dielectric layer at least filling a gap between two adjacent ones of the first sub-parts.

5 Claims, 22 Drawing Sheets

METHOD FOR MANUFACTURING SEMICONDUCTOR STRUCTURE, SEMICONDUCTOR STRUCTURE AND THREE-DIMENSIONAL STRUCTURE

CROSS-REFERENCE OF RELATED APPLICATIONS

The present application is a U.S. continuation application of International Application No. PCT/CN2022/105645, filed on Jul. 14, 2022, which claims priority to Chinese Patent Application No. 202210714303.4, filed on Jun. 22, 2022. International Application No. PCT/CN2022/105645 and Chinese Patent Application No. 202210714303.4 are incorporated herein by reference in their entireties.

BACKGROUND

With the development and progress of technology, the size of semiconductor devices becomes increasingly smaller, and semiconductor devices are developing towards miniaturization and high integration. A dynamic random access memory (DRAM) is a kind of semiconductor device which can randomly write and read data at high speed, and often widely used in data storage devices or apparatus. However, in practice, there are still many urgent problems to be improved in dynamic random access memory.

SUMMARY

Embodiments of the disclosure provide a method for manufacturing a semiconductor structure, including the following operations.

A substrate is provided, which includes a first region and a second region; a stacked structure is formed on the substrate, and the stacked structure includes first semiconductor layers and second semiconductor layers stacked alternately in sequence along a direction perpendicular to a plane where the substrate is located.

The stacked structure is etched, such that the first semiconductor layers and the second semiconductor layers located in the second region respectively form at least one first sub-part extending in a first direction and at least one third sub-part extending in the first direction, and the first semiconductor layers and the second semiconductor layers remaining in the first region respectively constitute a second sub-part extending in a second direction and a fourth sub-part extending in the second direction, the first direction is a direction parallel to the plane where the substrate is located, and the second direction is parallel to the plane where the substrate is located and perpendicular to the first direction.

The third sub-part is removed.

A first dielectric layer is formed and the first dielectric layer at least fills a gap between two adjacent ones of the first sub-parts.

Embodiments of the disclosure provide a semiconductor structure, which includes:

a substrate;

a stack of a plurality of first semiconductor layers on the substrate, the plurality of first semiconductor layers being sequentially arranged in a direction perpendicular to a plane where the substrate is located and a distance being provided between two adjacent ones of the first semiconductor layers, each of the first semiconductor layers includes at least one second sub-part extending in a second direction and at least one first sub-part extending in a first direction, the first direction and the second direction are both parallel to the plane where the substrate is located and perpendicular to each other;

the first sub-part includes a first section away from the second sub-part and a second section in contact with the second sub-part; and a first dielectric layer fills a gap between two adjacent ones of the first sections.

Embodiments of the disclosure provide a semiconductor structure, which includes:

a substrate;

a plurality of second sub-parts located above the substrate, the plurality of second sub-parts being sequentially arranged in a direction perpendicular to a plane where the substrate is located, and a distance being provided between two adjacent ones of the second sub-parts; in which the second sub-parts extend in a second direction parallel to the plane where the substrate is located; and a plurality of conductive lines, each of the conductive lines covering part of exterior surfaces of the second sub-parts.

Embodiments of the disclosure further provide a three-dimensional structure, including a plurality of the semiconductor structure in any of the above embodiments, and the semiconductor structures are repeatedly arranged in a three-dimensional space.

The details of one or more embodiments are set forth in the drawings and the description below. Other features and advantages of the disclosure will be apparent from the description and drawings, and from the claims.

BRIEF DESCRIPTION OF THE DRAWINGS

In order to more clearly illustrate the technical solutions of the embodiments of the disclosure, a brief description of the accompanying drawings used in the embodiments will be provided below. Apparently, the drawings of the following description are merely some embodiments of the disclosure. For a person of ordinary skill in the art, other drawings can be obtained based on these drawings without creative work.

DETAILED DESCRIPTION

Figure 1:
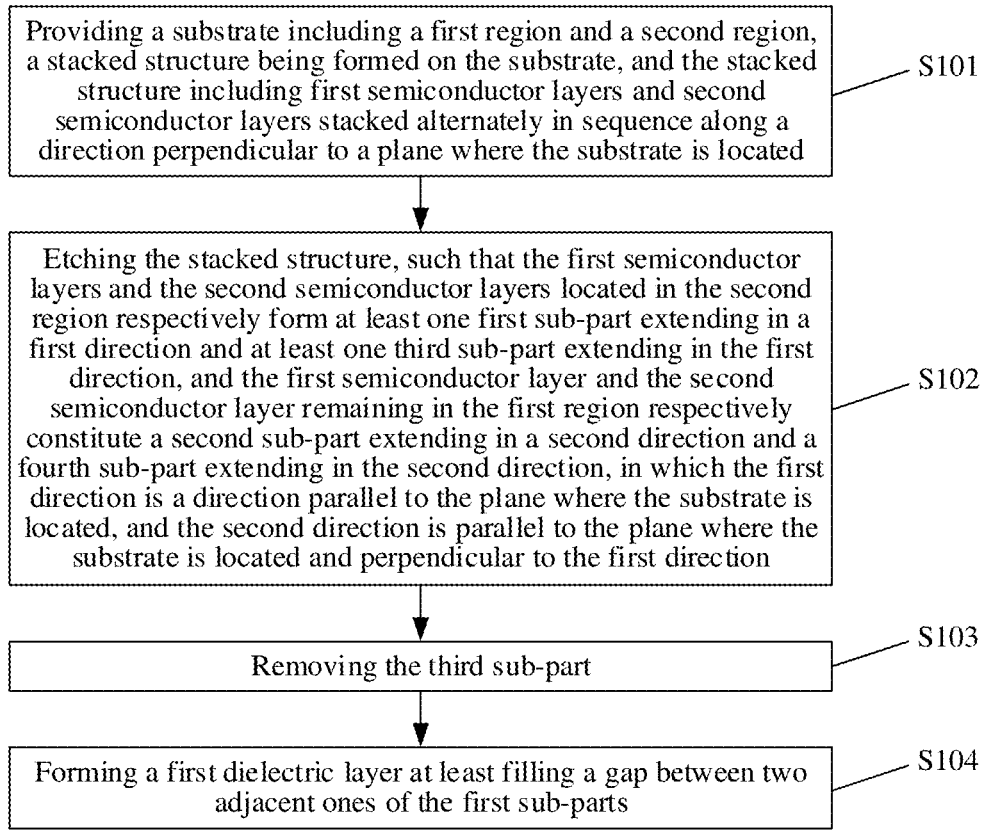
FIG. 1 is a flowchart of a method for manufacturing a semiconductor structure provided by embodiments of the disclosure.

The disclosure relates to the technical field of semiconductor manufacture, in particular to a method for manufacturing a semiconductor structure, a semiconductor structure and a three-dimensional structure.

Exemplary embodiments of the present disclosure will be described in more detail below with reference to the accompanying drawings. Although exemplary embodiments of the present disclosure are shown in the drawings, it should be understood that the present disclosure may be implemented in various forms and should not be limited to the specific embodiments set forth herein. These embodiments are provided so that the disclosure will be more thoroughly understood and the scope of the disclosure will be fully conveyed to those skilled in the art.

In the description herein below, numerous specific details are given to provide a more thorough understanding of the disclosure. However it will be apparent to those skilled in the art that the disclosure may be implemented without one or more of these details. In other examples, some technical features well-known in the art are not described in order to avoid confusion with the present disclosure; that is, not all of the features of actual implementation are described herein, and well-known functions and structures are not described in detail.

In the drawings, the dimensions of layers, regions, elements and their relative dimensions may be exaggerated for clarity. The same reference numeral denotes the same element throughout the text.

It should be understood that when an element or a layer is referred to as "on", "adjacent to", "connected to" or "coupled to" another element or layer, it may be directly on the other element or layer, adjacent to the other element or layer, or connected to or coupled to the other element or layer, or there may be an intermediate element or layer therebetween. In contrast, when an element is described as "directly on", "directly adjacent to", "directly connected to" or "directly coupled to" another element or layer, there is no intermediate element or layer therebetween. It should be understood that although the terms, "first", "second", "third" and the like may be used to describe various elements, components, regions, layers, and/or portions, these elements, components, regions, layers, and/or portions should not be limited by these terms. These terms are only used to distinguish one element, component, region, layer or portion from another element, component, region, layer or portion. Therefore, without departing from the teaching of the present disclosure, a first element, component, region, layer or portion discussed hereinafter may be expressed as a second element, component, region, layer or portion. While discussing a second element, component, region, layer or portion, it does not imply that a first element, component, region, layer or portion is necessarily present in the present disclosure.

Spatial relationship terms such as "beneath", "below", "lower", "under", "above", or "upper" may be used herein for convenience to describe a relationship between one element or feature and another element or feature shown in the drawings. It should be understood, the spatial relationship terms tend to further include different orientations of a device in use and operation in addition to the orientations shown in the drawings. For example, if the device in the drawings is turned over, an element or feature described as being "below" or "under" or "beneath" another element will be oriented as being "above" the other element or feature. Therefore, the exemplary terms "below" and "under" may include up and down orientations. The device may also include additional orientations (e.g., rotation for 90 degrees or other orientations), and the spatial terms used herein are interpreted accordingly.

The terms used herein are intended to describe specific embodiments only and are not to be a limitation to the present disclosure. As used herein, the singular forms "a/an", "one", and "the/said" are intended to include the plural forms as well, unless the context clearly dictates otherwise. It should be further understood that when terms "consist of" and/or "comprise/include" used in the specification mean that the stated features, integers, steps, operations, elements and/or components are present, but the presence or addition of one or more of other features, integers, steps, operations, elements, components and/or combinations is not excluded. When used herein, the term "and/or" includes any of the listed items and all combinations thereof.

A dynamic random access memory is a kind of semiconductor device which can randomly write and read data at high speed, and often widely used in data storage devices or apparatus. In general, the capacity of information storage in a memory can be effectively improved by increasing the integration thereof. In practice, a memory structure is usually formed by forming a plurality of transistor structures on the substrate first, and then forming capacitors at a side of the transistor structures far away from the substrate. However, in this structure, when the planar size of the substrate is fixed, the size of the transistor structure cannot be infinitely reduced, which greatly limits the further improvement of the integration of the memory.

On the basis of this, the following technical solution of the embodiments of the present disclosure is proposed.

The embodiments of the disclosure provide a method for manufacturing a semiconductor structure. As shown in FIG. 1, the method includes the following operations.

In S101, a substrate is provided, which includes a first region and a second region; a stacked structure is formed on the substrate, and the stacked structure includes first semiconductor layers and second semiconductor layers stacked alternately in sequence along a direction perpendicular to a plane where the substrate is located.

In S102, the stacked structure is etched, such that the first semiconductor layers and the second semiconductor layers located at the second region are etched to form at least one first sub-part extending in a first direction and at least one third sub-part extending in the first direction, respectively; the first semiconductor layers and the second semiconductor layers remaining at the first region constitute a second sub-part extending in a second direction and a fourth sub-part extending in the second direction, respectively, the first direction is a direction parallel to the plane where the substrate is located, and the second direction is parallel to the plane where the substrate is located and perpendicular to the first direction.

In S103, the third sub-part is removed.

In S104, a first dielectric layer is formed, and the first dielectric layer at least fills a gap between two adjacent ones of the first sub-parts.

In the embodiments of the disclosure, since the first sub-part is provided between the first dielectric layer, and the first semiconductor layer constituting the first sub-part and the first semiconductor layer constituting the second sub-part are of a continuous structure, in actual practice, the first dielectric layer can effectively support the second sub-part in the first region to prevent the phenomenon of collapse or fracture in the manufacture process, and thus significantly improve the stability of the semiconductor structure in the manufacture process.

In addition, since the first dielectric layer serving as a support is formed in a side region of the semiconductor structure instead of a middle region, when the semiconductor structure is subsequently formed with conductive lines or the like, there is no need to worry about the risk of poor contact caused by the first dielectric layer not being able to well wrap the conductive lines or the like, and the reliability of the semiconductor device is greatly improved.

In order to make the above objects, features and advantages of the disclosure more apparent and understandable, specific embodiments of the disclosure will be described in detail below with reference to the drawings. In detailing the embodiments of the disclosure, the schematic diagrams may be partially enlarged without in accordance with a general scale for convenience in description, and the schematic diagrams are only provided as examples, and not intend to limit the protection scope of the disclosure herein.

FIG. 1 is a flowchart of a method for manufacturing a semiconductor structure provided by embodiments of the disclosure; FIGS. 2 to 12 are process flow diagrams of a method for manufacturing a support structure provided by embodiments of the disclosure; in each figure, (a) is a top view, and (b) is a side view; FIG. 13 is a schematic three-dimensional structural diagram of a semiconductor structure provided by embodiments of the disclosure (a first cap layer and a second cap layer are not shown); FIGS. 14 to 17 are process flow diagrams of a method for manufacturing conductive lines provided by embodiments of the disclosure; in each figure, (a) is a top view, and (b) is a side view; and FIG. 18 shows side views of the conductive lines provided by embodiments of the disclosure in the direction of arrow a and the direction of arrow b of FIG. 17, respectively.

The method for manufacturing a semiconductor structure provided by the embodiments of the disclosure will be described in further detail below in combination with drawings.

Figure 2:
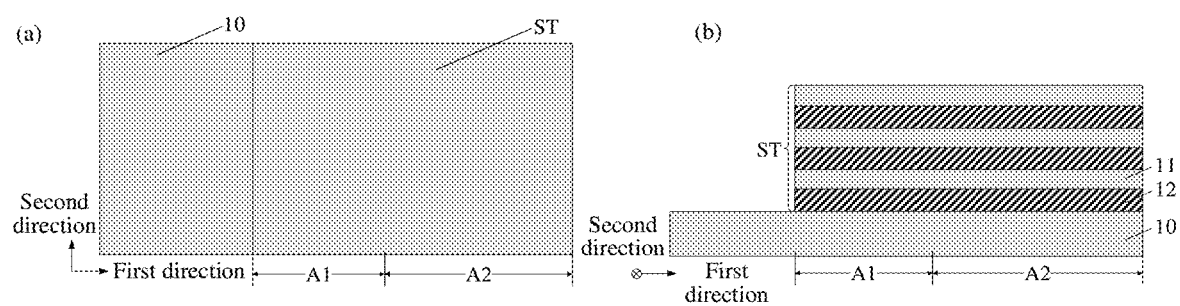
FIG. 2 is a process flow diagram of a method for manufacturing a support structure provided by embodiments of the disclosure; (a) is a top view, and (b) is a side view.

Firstly, in S101, as shown in FIG. 2, a substrate 10 is provided, which includes a first region A1 and a second region A2; a stacked structure ST is formed on the substrate 10, and the stacked structure ST includes first semiconductor layers 11 and second semiconductor layers 12 stacked alternately in sequence along a direction perpendicular to a plane where the substrate 10 is located.

Here, the substrate may be a semiconductor substrate, and specifically includes at least one elemental semiconductor material (e.g. silicon (Si) substrate, germanium (Ge) substrate or the like), at least one III-V compound semiconductor material (e.g. gallium nitride (GaN) substrate, gallium arsenide (GaAs) substrate, indium phosphide (InP) substrate or the like), at least one II-VI compound semiconductor material, at least one organic semiconductor material, or other semiconductor materials known in the art. In a specific embodiment of the disclosure, the substrate is a silicon substrate.

It should be noted that the drawings of the embodiments of the disclosure only schematically show that a certain number of the first semiconductor layers and the second semiconductor layers are stacked to form a stacked structure. In practice, the actual number of layers of the stacked structure is not limited by the number shown in the drawings in the embodiments of the disclosure, and specifically, the number of layers of the stacked structure may be set to not less than 24, such as 24, 48, 64, 128, 256, or the like, but not limited to. The number of layers of the stacked structure may also be more or less, which is not specifically limited here, and can be flexibly determined according to requirements in actual practice.

In some embodiments, the material of the first semiconductor layer includes, but is not limited to silicon or the like, and the material of the second semiconductor layer includes, but is not limited to silicon germanium or the like. The materials of the first semiconductor layer and the second semiconductor layer may also be other semiconductor materials.

Figure 3:
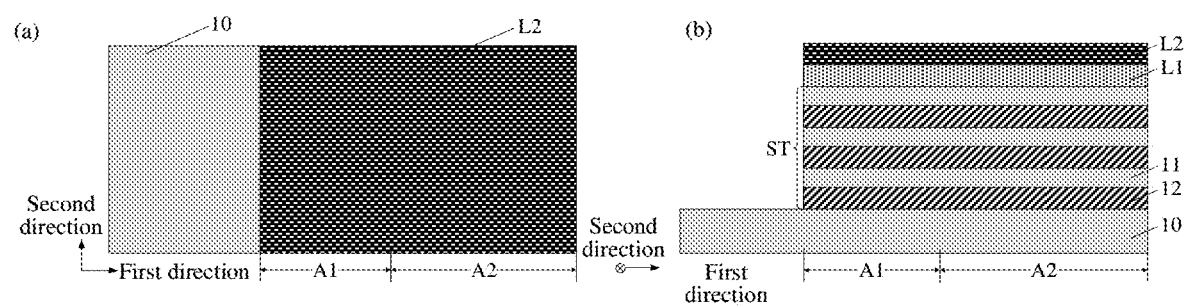
FIG. 3 is a process flow diagram of a method for manufacturing a support structure provided by embodiments of the disclosure; (a) is a top view, and (b) is a side view.

In some embodiments, as shown in FIG. 3, before the stacked structure ST is etched, the method further includes the following operations.

A first cap layer L1 covering the stacked structure ST is formed.

A second cap layer L2 covering the first cap layer L1 is formed.

Figure 4:
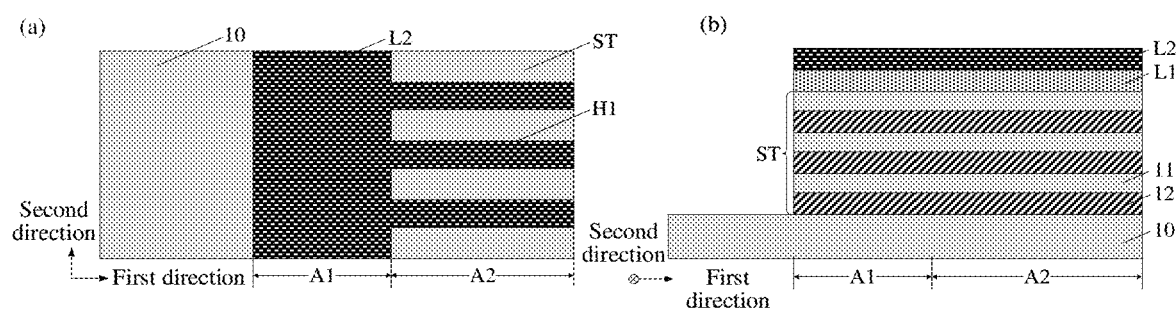
FIG. 4 is a process flow diagram of a method for manufacturing a support structure provided by embodiments of the disclosure; (a) is a top view, and (b) is a side view.
Figure 5:
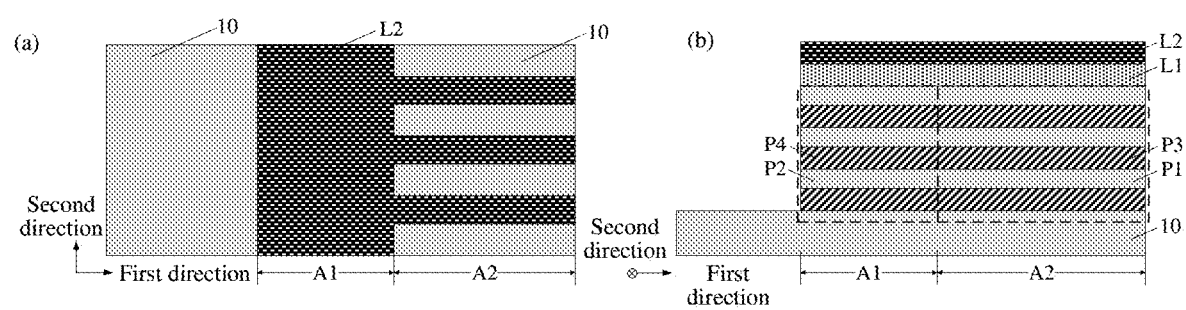
FIG. 5 is a process flow diagram of a method for manufacturing a support structure provided by embodiments of the disclosure; (a) is a top view, and (b) is a side view.

Next, in S102, as shown in FIGS. 4 and 5, the stacked structure ST is etched, such that the first semiconductor layers 11 and the second semiconductor layers 12 located in the second region A2 are etched to form at least one first sub-part P1 extending in the first direction and at least one third sub-part P3 extending in the first direction, respectively; the first semiconductor layers 11 and the second semiconductor layers 12 remaining in the first region A1 constitute a second sub-part P2 extending in the second direction and a fourth sub-part P4 extending in the second direction, respectively. The first direction is a direction parallel to the plane where the substrate 10 is located, and the second direction is parallel to the plane where the substrate 10 is located and is perpendicular to the first direction.

In some embodiments, as shown in FIGS. 4 and 5, the operation of etching the stacked structure ST includes the following operations.

The first cap layer L1 and the second cap layer L2 are patterned to form at least one pattern of first opening H1 extending in the first direction, and the first opening H1 pattern is located in the second region A2.

The stacked structure ST is etched by taking the patterned first cap layer L1 and the patterned second cap layer L2 as a mask, such that the first semiconductor layers 11 and the second semiconductor layers 12 located in the second region A2 are etched to form at least one first sub-part P1 extending in the first direction and at least one third sub-part P3 extending in the first direction, respectively.

In this embodiment, after the first sub-parts P1 and the third sub-parts P3 are formed, as shown in FIGS. 4 and 5, the stacked structure below the first opening H1 is removed, and the substrate 10 is exposed; herein, the first sub-part and the third sub-part that are vertically adjacent form a wall-like structure.

In practice, the material of the first cap layer includes, but is not limited to an oxide or the like, and the material of the second cap layer includes, but is not limited to a nitride or the like. Specifically, in some embodiments, the material of the first cap layer may be silicon oxide, and the material of the second cap layer may be silicon nitride.

Herein, a first cap layer and a second cap layer that have the first opening are formed firstly, and the first opening exposes the stacked structure. When etching the stacked structure by taking the first cap layer and the second cap layer as a mask layer, since the mask layer has a two-layer structure and thus has a larger thickness, even if the stacked structure has a larger number of layers, the mask layer can play a better protecting function during etching, thereby improving the morphology quality of the etched structure.

In some embodiments, the process of etching the stacked structure may include, but is not limited to, dry etching, wet etching or the like. Specifically, the stacked structure is etched by, for example, plasma etching or using an acidic solution etching or the like.

Figure 6:
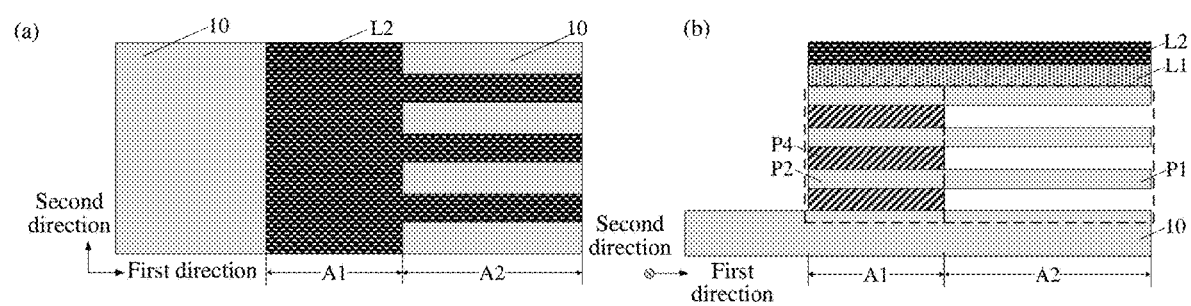
FIG. 6 is a process flow diagram of a method for manufacturing a support structure provided by embodiments of the disclosure; (a) is a top view, and (b) is a side view.

Next, in S103, as shown in FIG. 6, the third sub-part P3 is removed.

In one specific embodiment, the process of removing the third sub-part includes, but is not limited to, an etching process or the like. The etching process includes, but is not limited to, dry etching (e.g., plasma etching), wet etching (e.g., etching with an acidic solution), or the like.

Figure 7:
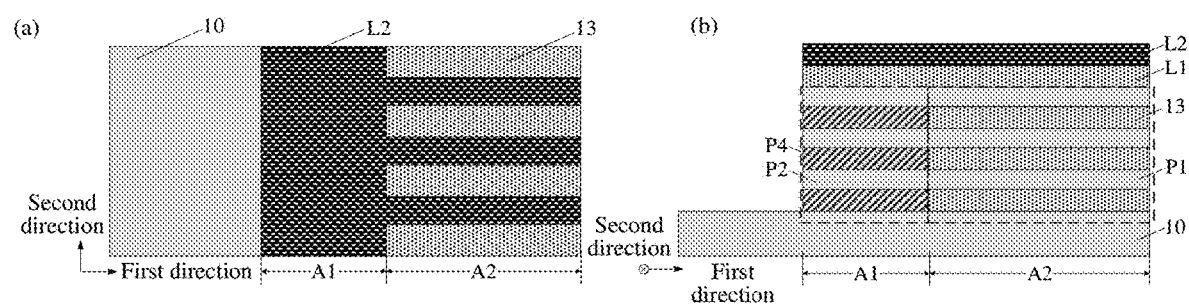
FIG. 7 is a process flow diagram of a method for manufacturing a support structure provided by embodiments of the disclosure; (a) is a top view, and (b) is a side view.

Finally, in S104, as shown in FIG. 7, a first dielectric layer 13 is formed and the first dielectric layer 13 at least fills a gap between two adjacent ones of the first sub-parts P1.

Here, the material of the first dielectric layer includes, but is not limited to an insulating material, such as an oxide, a nitride, nitrogen oxide, or the like. In some specific embodiments, the material of the first dielectric layer may be silicon oxide.

Figure 8:
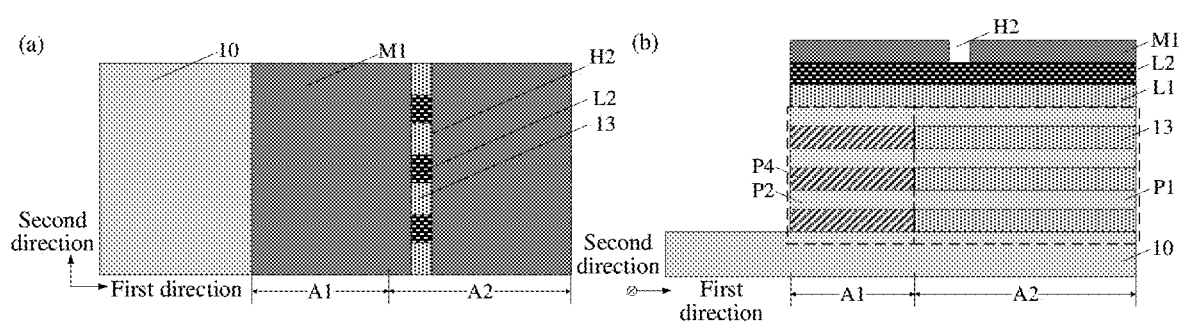
FIG. 8 is a process flow diagram of a method for manufacturing a support structure provided by embodiments of the disclosure; (a) is a top view, and (b) is a side view.
Figure 9:
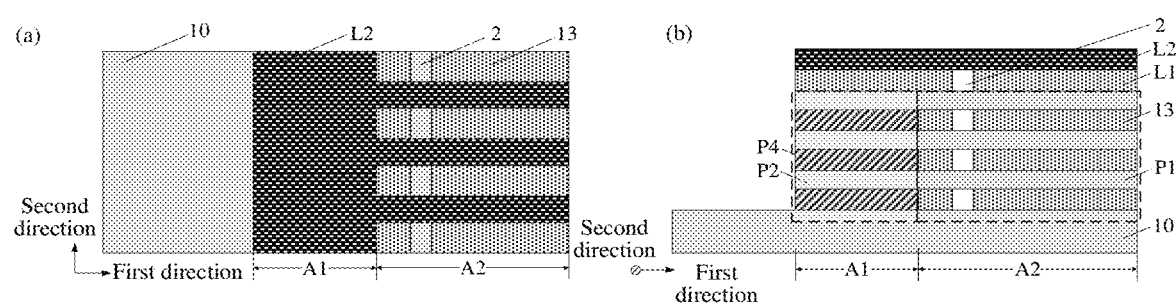
FIG. 9 is a process flow diagram of a method for manufacturing a support structure provided by embodiments of the disclosure; (a) is a top view, and (b) is a side view.
Figure 10:
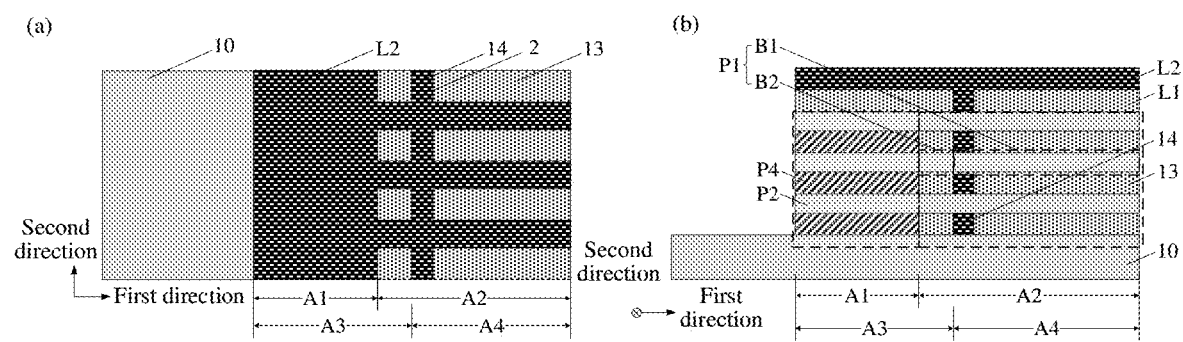
FIG. 10 is a process flow diagram of a method for manufacturing a support structure provided by embodiments of the disclosure; (a) is a top view, and (b) is a side view.
Figure 11:
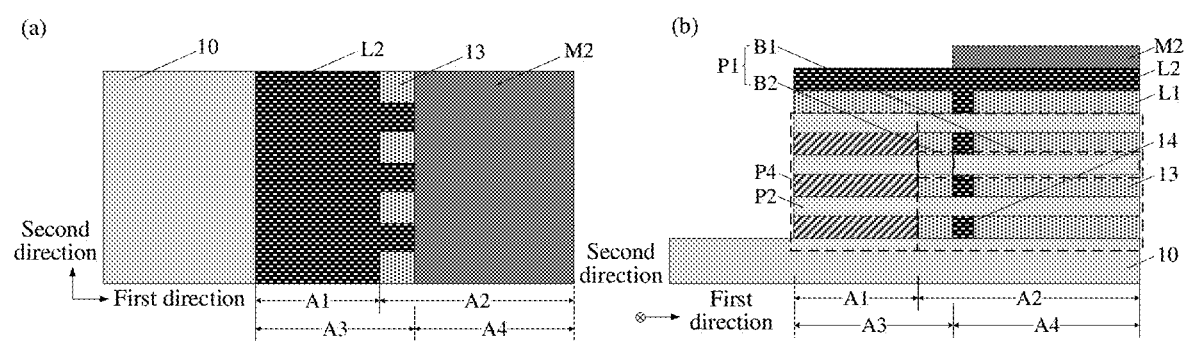
FIG. 11 is a process flow diagram of a method for manufacturing a support structure provided by embodiments of the disclosure; (a) is a top view, and (b) is a side view.

In some embodiments, as shown in FIGS. 8 to 10, after the first dielectric layer 13 is formed, the method further includes the following operations.

A first mask layer M1 is formed, which includes at least one second opening H2 extending in the second direction, and the second opening H2 is located above the second region A2.

Etching is performed to remove the first cap layer L1 and the first dielectric layer 13 below the second opening H2 to form an accommodation cavity 2 that is non-closed.

A second dielectric layer 14 is filled in the accommodation cavity 2.

In some embodiments, as shown in FIGS. 10 to 13, after the second dielectric layer 14 is filled in the accommodation cavity 2, the method further includes the following operations.

The first region A1 together with part of the second region between the first region A1 and the second dielectric layer 14 are defined as a third region A3; remaining second region A2 is defined as a fourth region A4, each first sub-part P1 located in the fourth region A4 is defined as a first section B1, and each first sub-part P1 located in the third region A3 is defined as a second section B2.

A second mask layer M2 is formed to cover the fourth region A4, and the second cap layer L2 and the first dielectric layer 13 located in the third region A3 are exposed.

The first cap layer L1, the second cap layer L2, the first dielectric layer 13 and the fourth sub-part P4 located in the third region A3 are removed by taking the second mask layer M2 as a mask, and the second sub-part P2 and the second section B2 of the first sub-parts P1 in the third region A3 are retained.

The first cap layer L1, the second cap layer L2, the first dielectric layer 13, and the second dielectric layer 14 located in the fourth region A4 are defined as a support structure SS.

During the process of this operation, the second dielectric layer can serve as an etching barrier layer to prevent the first dielectric layer located in the fourth region from being removed, so as to effectively protect the support structure from being damaged.

In the embodiments of the disclosure, after the support structure consisting of the first cap layer, the second cap layer, the first dielectric layer and the second dielectric layer is formed, since the first sub-part is provided between the first cap layer, the second cap layer, the first dielectric layer and the second dielectric layer, and the first semiconductor layer constituting the first sub-part and the first semiconductor layer constituting the second sub-part are of a continuous structure, in actual practice, the support structure consisting of the first cap layer, the second cap layer, the first dielectric layer and the second dielectric layer can effectively support the second sub-part in the first region to prevent the phenomenon of collapse or fracture in the subsequent process, and thus significantly improve the stability of the semiconductor structure in the manufacture process.

In addition, in term of the formation position of the support structure, since the support structure is formed in a side region of the semiconductor structure instead of a middle region, when the semiconductor structure is subsequently formed with structures such as conductive lines, the support structure will not wrap a structure such as the conductive lines, thus there is no need to worry about the risk of poor contact caused by the support structure not being able to well wrap the conductive lines or the like. It can be seen that the embodiments of the disclosure greatly improves the reliability of the semiconductor device compared with the conventional structure in which some support structures are formed in the middle region and easily lead to poor contact.

It should be noted that in order to clearly show the relationship among the features, the structures of the first cap layer and the second cap layer are omitted in FIG. 13.

In embodiments of the disclosure, after the support structure is formed, other operation(s) may be performed to form a conductive line structure on the second sub-part located in the first region.

Figure 14:
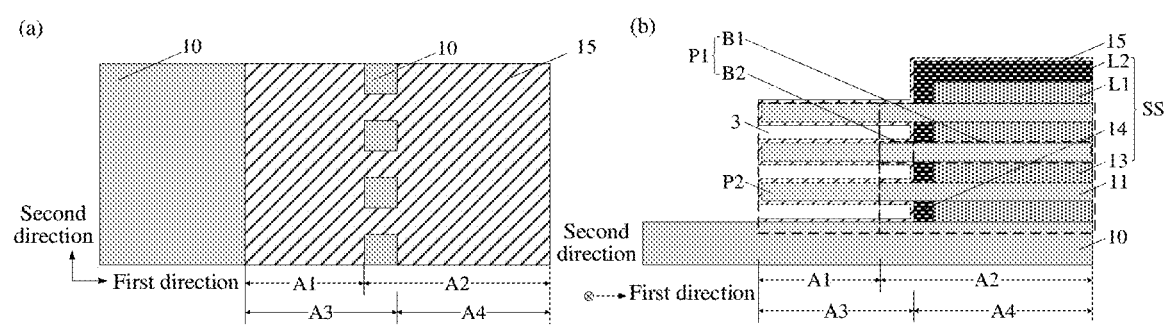
FIG. 14 is a process flow diagram of a method for manufacturing conductive lines provided by embodiments of the disclosure; (a) is a top view, and (b) is a side view.
Figure 15:
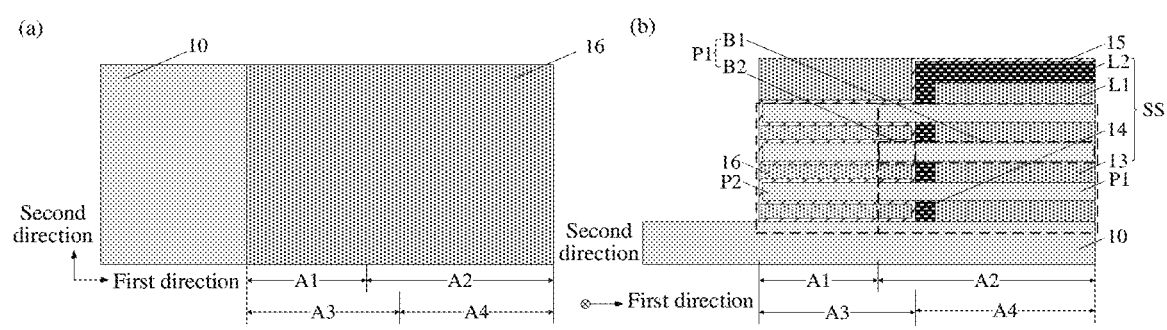
FIG. 15 is a process flow diagram of a method for manufacturing conductive lines provided by embodiments of the disclosure; (a) is a top view, and (b) is a side view.

As shown in FIGS. 14 and 15, after the first cap layer L1, the second cap layer L2, the first dielectric layer 13 and the fourth sub-part P4 located in the third region A3 are removed, the method further includes the following operations.

A conductive material layer 15 is formed, which at least conformally covers exposed exterior surfaces of the second sub-part P2, the second section B2 of the first sub-parts P1, the second dielectric layer 14, and the second cap layer L2, in which the conductive material layer 15 defines at least one cavity 3 that is non-closed.

A third dielectric layer 16 is formed, which covers the conductive material layer and fills the cavity 3.

Here, the material of the third dielectric layer may be the same as that of the first dielectric layer, or may be different. Specifically, in some embodiments, the material of the third dielectric layer includes, but is not limited to an insulating material, such as an oxide, a nitride, nitrogen oxide or the like. Optionally, the material of the third dielectric layer may be silicon oxide.

In some embodiments, before the conductive material layer is formed, the method further includes: etching one side of the second sub-part located in the first region in the second direction to form a plurality of staircase-shaped connecting regions (not shown); after the conductive material layer is formed on the second sub-part, a plurality of conductive plugs (not shown) may be formed on the staircase-shaped connecting regions, the conductive plugs (not shown) facilitates the electrical connection of the conductive material layer to a peripheral circuit structure (not shown) or other circuit structures (not shown).

It could be understood that the support structure can effectively support the second sub-part not only in the process of forming the conductive material layer, but also in the process of forming the staircase-shaped connecting regions to prevent the collapse or fracture phenomenon in the process of forming the staircase-shaped connecting region.

Therefore, the support structure of the embodiments of the disclosure significantly improves the stability of the semiconductor structure in the manufacture process.

It could be understood that in the embodiments of the disclosure, the support structure only serves as a support, but not as a functional part of the semiconductor structure in information processing. For this reason, in some embodiments of the disclosure, the support structure and other structures located in the second region can also be removed together, the performance of the semiconductor structure with the support structure removed is not affected, and the volume and weight of the semiconductor structure can be effectively reduced.

Figure 16:
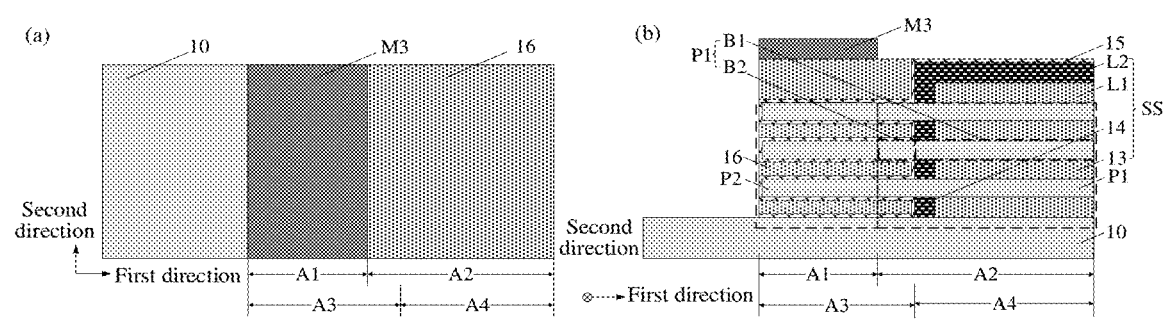
FIG. 16 is a process flow diagram of a method for manufacturing conductive lines provided by embodiments of the disclosure; (a) is a top view, and (b) is a side view.
Figure 17:
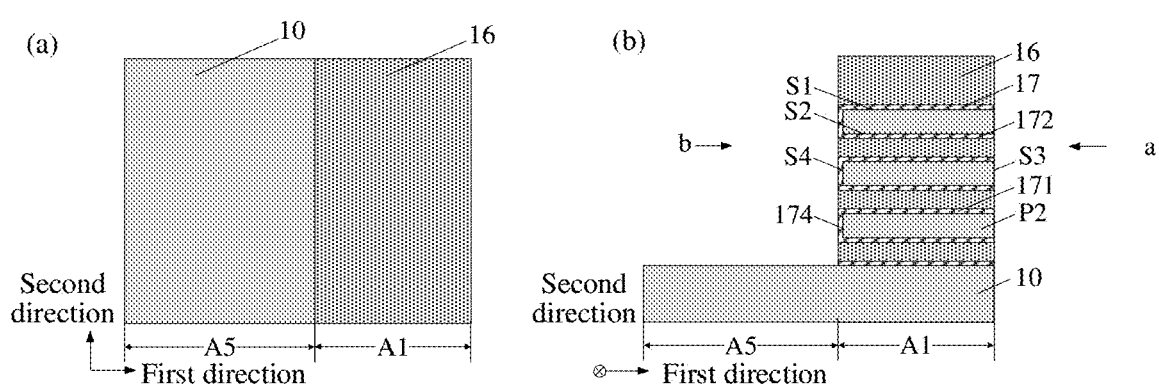
FIG. 17 is a process flow diagram of a method for manufacturing conductive lines provided by embodiments of the disclosure; (a) is a top view, and (b) is a side view.
Figure 18:
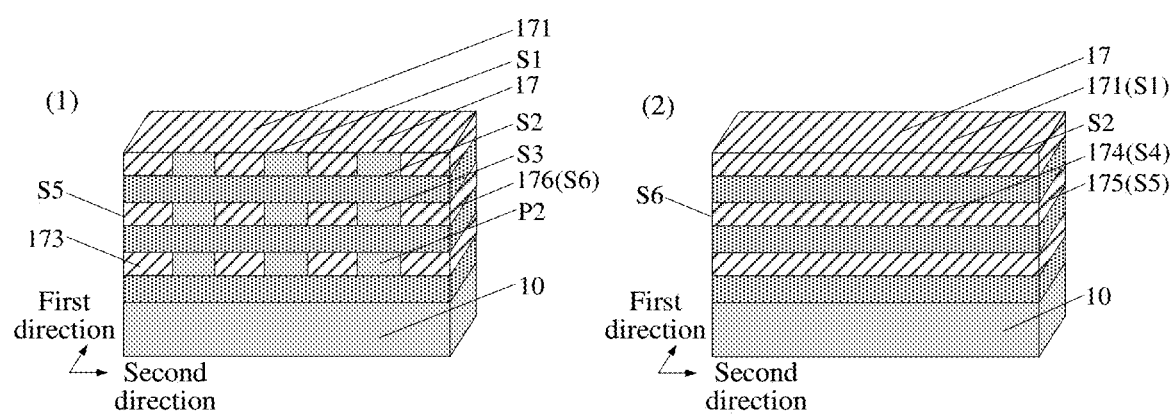
FIG. 18 shows side views of the conductive lines provided by embodiments of the disclosure in the direction of arrow a and the direction of arrow b of FIG. 17 respectively.

As shown in FIGS. 16 to 18, after the third dielectric layer 16 is formed, the method further includes the following operations.

A third mask layer M3 is formed, which covers the first region A1 and exposes the second region A2.

The support structure SS, the first sub-part P1, the third dielectric layer 16, and the conductive material layer 15 in the second region A2 are removed by taking the third mask layer M3 as a mask, such that the conductive material layer 15 remaining in the first region A1 forms a plurality of conductive lines 17 that are sequentially arranged in a direction perpendicular to the plane where the substrate 10 is located and extend in the second direction.

In some embodiments, as shown in FIGS. 17 and 18, (1) of FIG. 18 is a side view in the direction of the arrow a in FIG. 17, and (2) of FIG. 18 is a side view in the direction of the arrow b in FIG. 17. It can be seen that the exterior surface of the second sub-part P2 includes an upper surface S1, a lower surface S2, a first side surface S3 and a second side surface S4 parallel to the second direction, and a third side surface S5 and a fourth side surface S6 perpendicular to the second direction.

The conductive line 17 includes a first part 171, a second part 172, a third part 173, a fourth part 174, a fifth part 175 and a sixth part 176 covering the upper surface S1, the lower surface S2, the first side surface S3, the second side surface S4, the third side surface S5 and the fourth side surface S6, respectively.

Optionally, the conductive lines 17 may be used as bit lines or word lines of a semiconductor structure, but is not limited thereto; they may also be used as other conductive structures without specific limitation herein.

Optionally, in another embodiment of the disclosure, after the conductive material layer is formed, the support structure and the first sub-part in the second region may also be retained, and then other structures may be formed on the side of the conductive material layer away from the support structure.

It should be understood that the support structure provided by the embodiments of the disclosure can support not only the bit lines or the word lines, but also other parts. For example, in some other embodiments, the support structure may be used to support active pillars; in such embodiments, without the need of manufacturing a conductive material layer, the support structure is used to support the second sub-part that serves as an active pillar for forming the transistor.

Figure 19:
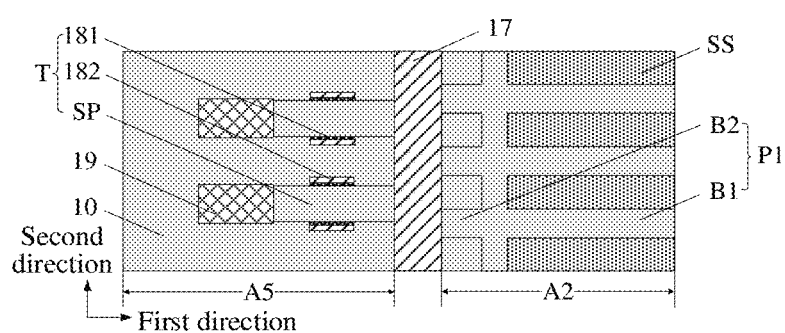
FIG. 19 is a schematic structural diagram of another semiconductor structure provided by embodiments of the disclosure.
Figure 20:
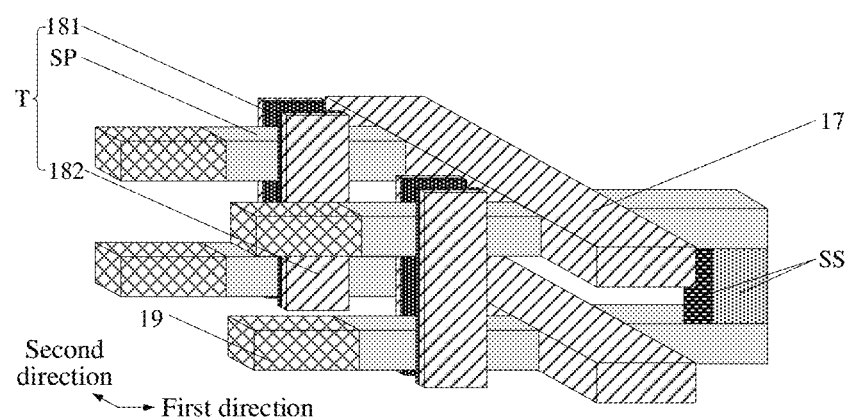
FIG. 20 is a schematic three-dimensional structural diagram of another semiconductor structure provided by embodiments of the disclosure.

FIG. 19 is a schematic structural diagram of another semiconductor structure provided by embodiments of the disclosure; and FIG. 20 is a schematic three-dimensional structural diagram of another semiconductor structure provided by embodiments of the disclosure.

As shown in FIG. 19, the substrate 10 further includes a fifth region A5, and after the structure of FIG. 14 is formed, other structures may be subsequently formed in the region A5 of the substrate 10.

Specifically, as shown in FIGS. 19 and 20, the transistor structures T are formed on the side of the conductive lines 17 away from the second region A2.

The memory node structures 19 are formed on the side of the transistor structures T away from the conductive lines 17.

In practice, each transistor structure T includes at least an active pillar SP, a gate dielectric layer 181 and a word line 182.

In practice, the formation of the transistor structures and the formation of memory node structures may be achieved by regrowing a material layer in the fifth region. Optionally, the method for forming the transistor structures and the method for forming the memory node structure may be the same as or different from the conventional method, and will not be described here.

Optionally, in another embodiment of the disclosure, after the support structure is formed and the fourth sub-part is removed, the support structure and the first sub-part in the second region may also be retained, and then other structures may be formed on the side of the second sub-part away from the support structure by etching the second sub-part.

Figure 21:
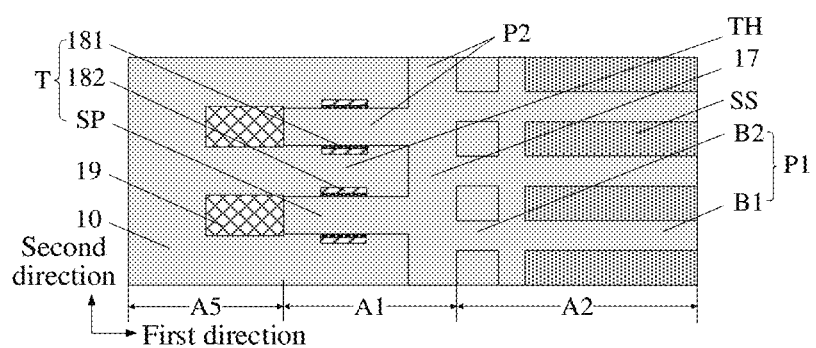
FIG. 21 is a schematic structural diagram of yet another semiconductor structure provided by embodiments of the disclosure.
Figure 22:
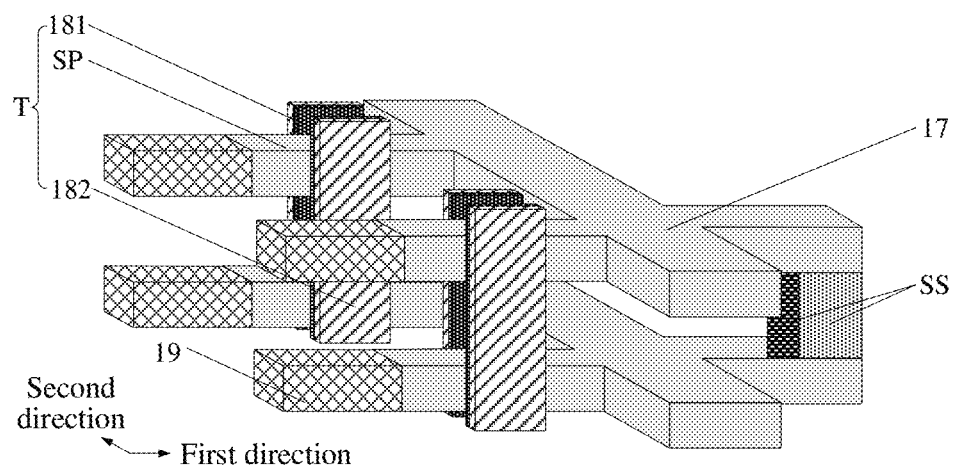
FIG. 22 is a schematic three-dimensional structural diagram of yet another semiconductor structure provided by embodiments of the disclosure.

FIG. 21 is a schematic structural diagram of yet another semiconductor structure provided by embodiments of the disclosure; and FIG. 22 is a schematic three-dimensional structural diagram of yet another semiconductor structure provided by embodiments of the disclosure.

In this embodiment, as shown in FIGS. 5, 12, 21 and 22, the operation of etching the stacked structure ST includes the following operations.

The stacked structure ST located in the second region A2 is etched to form at least one structure extending in the first direction, in which the first semiconductor layer 11 and the second semiconductor layer 12 located in the second region A2 are etched to form at least one first sub-part P1 and at least one third sub-part P3 extending in the first direction, respectively; and the first semiconductor layer 11 and the second semiconductor layer 12 remaining in the first region are defined as a second sub-part P2 and a fourth sub-part P4, respectively, the second sub-part P2 and the fourth sub-part P4 are of planar structures.

After the first cap layer L1, the second cap layer L2, the first dielectric layer 13 and the fourth sub-part P4 located in the third region are removed, the method further includes the following operations.

Part of the second sub-part P2 is removed by etching to form a plurality of trenches TH penetrating the second sub-part P2 and extending in the first direction, and parts of the second sub-part P2 between the trenches TH form a plurality of active pillars SP extending in the first direction.

A gate dielectric layer 181 is filled at a middle region of the trench TH, which covers a sidewall of the active pillar SP exposed by the middle region of the trench TH and extends in a direction perpendicular to the substrate 10.

Word lines 182 are formed on the gate dielectric layer and extend in a direction perpendicular to the substrate 10.

In this embodiment, after the word lines 182 are formed, the method further includes the following operation.

Memory node structures 19 are formed on the side of the active pillars SP away from the support structure SS.

Optionally, as shown in FIG. 21, after the memory node structures 19 are formed, a conductive line 17 may also be formed on a part of the second sub-part P2 where the active pillar is not formed and extends in the second direction by doping.

It should be noted that in order to clearly show the connection relationship between the first sub-part and the second sub-part, the structures of the first cap layer and the second cap layer are omitted in FIGS. 19 to 22.

In the above two embodiments, in the process of forming the active pillars, the transistor structures and the memory node structures, the support structure can support the second sub-part to prevent the collapse or fracture phenomenon in the manufacture process, which improves the stability of the semiconductor structure in the manufacture process.

In addition, in the above two embodiments, a plurality of staircase-shaped connecting regions (not shown) may be formed by etching at one side of the conductive line extending in the second direction, next a plurality of conductive plugs (not shown) may be formed on the staircase-shaped connecting regions, the conductive plugs (not shown) facilitates the electrical connection of the conductive material layer to a peripheral circuit structure (not shown) or other circuit structures (not shown).

It could be understood that the support structure can well support the structures located in the first region and/or the fifth region in the process of forming the staircase-shaped connecting regions to prevent the collapse or fracture phenomenon in the process of forming the staircase-shaped connecting regions. Therefore, the support structure of the embodiments of the disclosure significantly improves the stability of the semiconductor structure in the manufacture process.

Moreover, in the embodiments of the disclosure, since memory cells, each of which consists of a transistor structure and a memory node structure located on one side of the transistor, are formed on the substrate in a horizontally arranged manner, and the memory cells form a stacked structure with a multi-layer structure on the substrate in a stacking manner, so that the integration of the finally formed semiconductor structure is not limited by the size of the substrate and the size of the transistor. Therefore, the embodiments of the disclosure can effectively improve the integration of the semiconductor structure.

Figure 12:
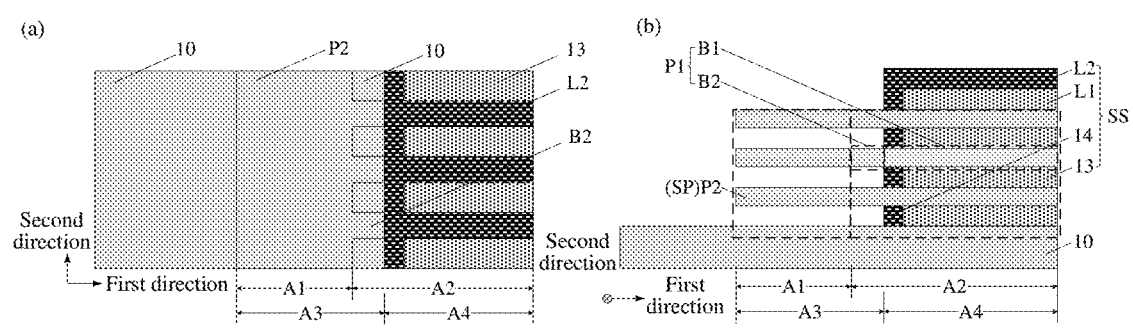
FIG. 12 is a process flow diagram of a method for manufacturing a support structure provided by embodiments of the disclosure; (a) is a top view, and (b) is a side view.
Figure 13:
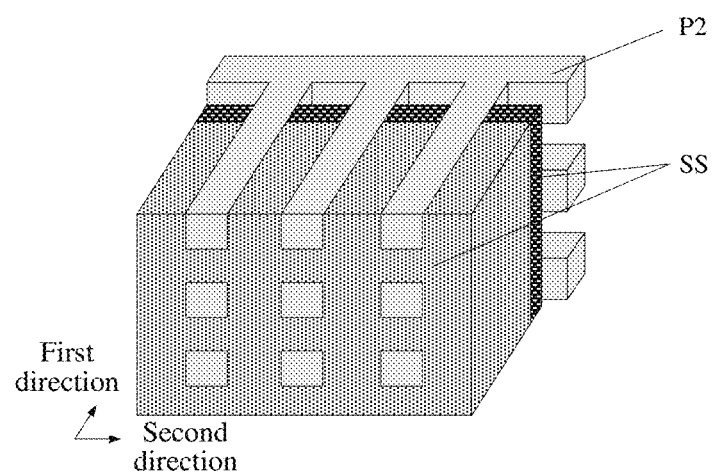
FIG. 13 is a schematic three-dimensional structural diagram of a semiconductor structure provided by embodiments of the disclosure (a first cap layer and a second cap layer are not shown)

Embodiments of the disclosure further provide a semiconductor structure, as shown in FIGS. 12, 14 and 15, which includes:

a substrate 10;

a stack of a plurality of first semiconductor layers 11 on the substrate 10, the plurality of first semiconductor layers 11 being sequentially arranged in a direction perpendicular to a plane where the substrate 10 is located, and a distance being provided between two adjacent ones of the first semiconductor layers 11, each of the first semiconductor layers 11 includes one second sub-part P2 extending in a second direction and at least one first sub-part P1 extending in a first direction, the first direction and the second direction are both parallel to the plane where the substrate 10 is located and are perpendicular to each other;

the first sub-part P1 includes a first section B1 away from the second sub-part P2 and a second section B2 in contact with the second sub-part P2; and a first dielectric layer 13 fills a gap between two adjacent ones of the first sections B1.

Here, the substrate 10 may include a first region A1 and a second region A2.

In some embodiments, as shown in FIG. 12, the second sub-part is an active pillar SP.

Here, the active pillar extends along the second direction. Since the active pillar and the first sub-part are of a continuous structure, when other structure(s) is arranged on the active pillar, the first dielectric layer between the first sub-parts can play a good supporting role for the active pillar to prevent it from collapsing or breaking.

In some embodiments, the semiconductor structure further includes: a first cap layer L1 and a second cap layer L2, the first cap layer L1 covering an upper surface of the uppermost first section B1 and the second cap layer L2 covering an upper surface of the first cap layer L1; and a second dielectric layer 14 covering sidewalls of the first dielectric layer 13, the first cap layer L1 and the second cap layer L2.

Here, the material of the first cap layer L1 is the same as the material of the first dielectric layer 13, and the material of the second dielectric layer 14 is the same as the material of the second cap layer L2.

In practice, the material of the first cap layer and the first dielectric layer includes, but is not limited to, an insulating material, such as an oxide, a nitride, nitrogen oxide, or the like, and the material of the second dielectric layer and the second cap layer may also include, but is not limited to, an insulating material. Optionally, the material of the first cap layer and the first dielectric layer may be silicon oxide, and the material of the second dielectric layer and the second cap layer may be silicon nitride.

Continuously referring to FIG. 15, the first region A1 together with a region between the first region A1 and the second dielectric layer 14 are defined as a third region A3; the second region A2 where the region between the first region A1 and the second dielectric layer 14 is removed is defined as a fourth region A4, the part of each first sub-part P1 located in the fourth region A4 is defined as a first section B1, and the part located in the third region A3 is defined as a second section B2.

Herein, the first cap layer L1, the second cap layer L2, the first dielectric layer 13, and the second dielectric layer 14 located in the fourth region A4 are defined as a support structure SS.

In practice, as shown in FIG. 14, the semiconductor structure further includes:

a conductive material layer 15 covering exterior surfaces of the second sub-part P2 and the second section B2, sidewalls of the second dielectric layer 14, and an upper surface of the second cap layer L2.

Here, the conductive material layer includes, but is not limited to titanium nitride, tungsten or other conductive materials.

In practice, the support structure consisting of the first cap layer, the second cap layer, the first dielectric layer and the second dielectric layer can effectively support the second sub-part in the first region to prevent the phenomenon of collapse or fracture in the process of forming the conductive material layer, which significantly improves the stability of the semiconductor structure.

In addition, in term of the formation position of the support structure, since the support structure is formed in a side region of the semiconductor structure instead of a middle region, in the semiconductor structure, the support structure will not wrap a structure such as the conductive material layer, thus there is no need to worry about the risk of poor contact caused by the support structure not being able to well wrap the conductive material layer or the like. It can be seen that the embodiments of the disclosure greatly improves the reliability of the semiconductor device compared with the conventional structure in which some support structures are provided in the middle region and easily lead to poor contact.

In practice, the conductive material layer is word lines or bit lines.

It could be understood that when the conductive material layer serves as word lines, it usually electrically connects with the word line driver for better electrical connection in a multilayer structure. At this time, it is generally desirable to provide a plurality of staircase-shaped connecting regions (not shown) on the side of the conductive material layer (word line) in the second direction, and then a plurality of conductive plugs (not shown) are provided on the staircase-shaped connecting regions, and the plurality of conductive plugs (not shown) can be used to electrically connect the conductive material layer (word lines) to the word line driver.

Similarly, when the conductive material layer serves as bit lines, it usually electrically connects with the sense amplifier for better electrical connection in a multilayer structure. At this time, it is generally desirable to provide a plurality of staircase-shaped connecting regions (not shown) on the side of the conductive material layer (bit line) in the second direction, and then a plurality of conductive plugs (not shown) are provided on the staircase-shaped connecting regions, and the plurality of conductive plugs (not shown) can be used to electrically connect the conductive material layer (bit line) to the sense amplifier.

Here, the support structure can effectively support the second sub-part not only in the process of forming the conductive material layer, but also in the process that staircase-shaped connecting regions are provided when the conductive material layer serves as word lines or bit lines, the word lines or bit lines thus can also be well supported to prevent the collapse or fracture phenomenon. Therefore, the support structure of the embodiments of the disclosure significantly improves the stability of the semiconductor structure in the manufacture process.

In some other embodiments, as shown in FIGS. 19 to 22, the semiconductor structure may also include transistor structures T and memory node structures 19, in which the transistor structures T are disposed on a side of the conductive line 17 away from the support structure SS, and the memory node structure 19 is disposed on a side of the transistor structure T away from the conductive line 17. In this embodiment, each transistor structure T includes at least an active pillar SP, a gate dielectric layer 181 and a word line 182.

In some embodiments, as shown in FIGS. 19 and 20, the conductive line and the active pillar are of a discontinuous structure.

In other embodiments, as shown in FIGS. 21 and 22, the conductive line and the active pillar are of a continuous structure.

It could be understood that in the embodiments of the disclosure, the support structure only serves as a support, but not as a functional part of the semiconductor structure in information processing. For this reason, in another embodiment of the disclosure, the support structure and other structures located in the second region can also be removed together, the performance of the semiconductor structure with the support structure removed is not affected, and the volume and weight of the semiconductor structure can be effectively reduced.

As shown in FIGS. 17 and 18, the semiconductor structure includes:

a substrate 10;

a plurality of second sub-parts P2 located above the substrate 10, the plurality of second sub-parts P2 being sequentially arranged in a direction perpendicular to a plane where the substrate 10 is located, and a distance being provided between two adjacent ones of the second sub-parts P2;

the second sub-parts P2 extending in a second direction parallel to the plane where the substrate is located; and a plurality of conductive lines 17, each of the conductive lines 17 covering part of exterior surfaces of the second sub-parts P2.

In practice, the conductive lines are used as word lines or bit lines of the semiconductor structure. When the conductive lines are used as the word lines, they usually electrically connect with a word line driver, and when the conductive lines are used as the bit lines, they usually electrically connect with a sense amplifier.

In this embodiment, the exterior surface of the second sub-part P2 includes an upper surface S1, a lower surface S2, a first side surface S3 and a second side surface S4 parallel to the second direction, and a third side surface S5 and a fourth side surface S6 perpendicular to the second direction.

The conductive lines 17 include a first part 171, a second part 172, a third part 173, a fourth part 174, a fifth part 175 and a sixth part 176 covering the upper surface S1, the lower surface S2, the first side surface S3, the second side surface S4, the third side surface S5 and the fourth side surface S6, respectively.

Continuously referring to FIGS. 17 and 18, it can be seen that the first part 171, the second part 172, the fourth part 174, the fifth part 175, and the sixth part 176 are of a continuous structure, and the third part 173 includes a plurality of discrete conductive pads (not identified in the figures) which are sequentially arranged in the second direction.

Here, the conductive pads can be used as connection regions for connecting with other structures.

In addition, the conductive lines located on the upper and lower surfaces, the second side surface, the third side surface and the fourth side surface of the second sub-part are provided as a continuous structure, so that a plurality of surfaces of the second sub-part are covered by the conductive material layers to the maximum extent, which can effectively reduce the resistance of the conductive line structure itself, and thus the power consumption of the semiconductor structure in use can be reduced.

It should be noted that the figures of the embodiments of the disclosure only schematically show that a certain number of the first semiconductor layers are sequentially arranged in a direction perpendicular to the substrate. In practice, the actual number of layers of the first semiconductor layers is not limited by the number shown in the drawings in the embodiments of the disclosure, and specifically, the number of layers of the first semiconductor layers may be set to not less than 12, such as 12, 24, 32, 64, 128, or the like, but not limited to. The number of layers of the stacked structure may also be more or less values, which is not specifically limited here, and can be flexibly determined according to requirements in actual practice.

In the embodiments of the disclosure, since memory cells, each of which consists of a transistor structure and a memory node structure located on one side of the transistor, are formed on the substrate in a horizontally arranged manner, and the memory cells form a stacked structure with a multi-layer structure on the substrate in a stacking manner, so that the integration of the finally formed semiconductor structure is not limited by the size of the substrate and the size of the transistor. Therefore, the embodiments of the disclosure can effectively improve the integration of the semiconductor structure.

Embodiments of the disclosure further provide a three-dimensional structure, including the semiconductor structure involved in any of the above embodiments, and the semiconductor structures are repeatedly arranged in a three-dimensional space. For example, the semiconductor structures are sequentially spaced apart from each other in the first direction and the second direction parallel to the substrate, and are stacked in the third direction perpendicular to the substrate.

The three-dimensional structure provided by the embodiments of the disclosure can be applied to a memory structure that includes but is not limited to a three-dimensional dynamic random access memory (3D DRAM for short).

In this embodiment, the semiconductor structures are sequentially spaced apart from each other in the first direction and the second direction of the substrate, and are stacked in the third direction perpendicular to the substrate, which can further improve the integration of the finally formed semiconductor device.

It should be noted that the method for manufacturing the semiconductor device provided by the embodiment of the disclosure can be applied to a DRAM structure or other semiconductor devices without too much limitation herein. The embodiments of the method for manufacturing a semiconductor device and the embodiments of the semiconductor device in the disclosure belong to the same concept. Any technical feature(s) of the technical solution described in each embodiment can be arbitrarily combined with each other if there is no conflict The description above is only preferred embodiments of the disclosure, and is not intended to limit the protection scope of the present disclosure. Any modification, equivalent replacement or improvement made within the spirit and principle of the disclosure falls within the protection scope of the disclosure.

What is claimed is:

1. A method for manufacturing a semiconductor structure, comprising:
   providing a substrate, the substrate comprising a first region and a second region; a stacked structure being formed on the substrate, and the stacked structure comprising first semiconductor layers and second semiconductor layers stacked alternately in sequence along a direction perpendicular to a plane where the substrate is located;
   etching the stacked structure, such that the first semiconductor layers and the second semiconductor layers located in the second region respectively form at least one first sub-part extending in a first direction and at least one third sub-part extending in the first direction, and the first semiconductor layers and the second semiconductor layers remaining in the first region respectively constitute a second sub-part extending in a second direction and a fourth sub-part extending in the second direction, the first direction being a direction parallel to the plane where the substrate is located, and the second direction being parallel to the plane where the substrate is located and perpendicular to the first direction;
   removing the third sub-part; and
   forming a first dielectric layer at least filling a gap between two adjacent ones of first sub-part;
   wherein before the stacked structure is etched, the method further comprises:
   forming a first cap layer covering the stacked structure; and
   forming a second cap layer covering the first cap layer;
   wherein after the first dielectric layer is formed, the method further comprises:
   forming a first mask layer, the first mask layer comprising at least one second opening extending in the second direction, and the second opening being located above the second region;
   removing the first cap layer and the first dielectric layer below the second opening by etching to form an accommodation cavity that is non-closed; and
   filling a second dielectric layer in the accommodation cavity;
   wherein the first region together with a region between the first region and the second dielectric layer are defined as a third region; the second region into which the region between the first region and the second dielectric layer is not counted is defined as a fourth region, the first sub-part located in the fourth region is defined as a first section, and the first sub-part located in the third region is defined as a second section,
   wherein after the second dielectric layer is filled in the accommodation cavity, the method further comprises:

forming a second mask layer covering the fourth region and exposing the second cap layer and the first dielectric layer located in the third region; and removing the first cap layer, the second cap layer, the first dielectric layer and the fourth sub-part located in the third region by taking the second mask layer as a mask, and retaining the second sub-part and the second section of the first sub-part located in the third region, wherein the first cap layer, the second cap layer, the first dielectric layer, and the second dielectric layer located in the fourth region are defined as a support structure.

2. The method of claim 1, wherein etching the stacked structure comprises:

patterning the first cap layer and the second cap layer to form at least one first opening pattern extending in the first direction, the first opening pattern being located in the second region; and etching the stacked structure by taking a patterned first cap layer and a patterned second cap layer as a mask, such that the first semiconductor layers and the second semiconductor layers located in the second region respectively form the at least one first sub-part extending in the first direction and the at least one third sub-part extending in the first direction.

3. The method of claim 1, wherein after the first cap layer, the second cap layer, the first dielectric layer and the fourth sub-part located in the third region are removed, the method further comprises:

forming a conductive material layer, the conductive material layer at least conformally covering exposed exterior surfaces of the second sub-part, the second section of the first sub-part, the second dielectric layer, and the second cap layer; wherein the conductive material layer defines at least one cavity that is non-closed; and forming a third dielectric layer, the third dielectric layer covering the conductive material layer and filling the cavity.

4. The method of claim 3, wherein after the third dielectric layer is formed, the method further comprises:

forming a third mask layer, the third mask layer covering the first region and exposing the second region; and removing the support structure, the first sub-part, the third dielectric layer, and the conductive material layer in the second region by taking the third mask layer as a mask, such that the conductive material layer remaining in the first region forms a plurality of conductive lines that are sequentially arranged in the direction perpendicular to the plane where the substrate is located and extend in the second direction.

5. The method of claim 4, further comprising:

forming transistor structures on a side of the conductive lines away from the second region; and forming memory node structures on a side of the transistor structures away from the conductive lines.

* * * * *